United States Patent
Zurcher (10) Patent No.: US 7,666,698 B2
(45) Date of Patent: Feb. 23, 2010

(54) METHOD FOR FORMING AND SEALING A CAVITY FOR AN INTEGRATED MEMS DEVICE

(75) Inventor: Peter Zurcher, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 234 days.

(21) Appl. No.: 11/386,147

(22) Filed: Mar. 21, 2006

(65) Prior Publication Data

US 2007/0224832 A1    Sep. 27, 2007

(51) Int. Cl.
H01L 21/00 (2006.01)
H01L 21/31 (2006.01)
H01L 21/469 (2006.01)

(52) U.S. Cl. .................... 438/50; 438/106; 438/110; 257/414; 257/528

(58) Field of Classification Search ............... 438/106, 438/110; 257/414, 528
See application file for complete search history.

(56) References Cited

U.S. PATENT DOCUMENTS

| | | | |
|---|---|---|---|
| 6,635,509 B1 * | 10/2003 | Ouellet | ................. 438/106 |
| 2003/0183916 A1 | 10/2003 | Heck et al. | |
| 2004/0166606 A1 | 8/2004 | Forehand | |
| 2005/0007217 A1 | 1/2005 | Deligianni et al. | |

OTHER PUBLICATIONS

Brand, "Advanced Micro and Nanosystems. vol. 2. CMOS-MEMS, Chap. 1: Fabrication Technology," Jan. 2005, Wiley-VCH Verlag GmbH & Co. KGaA, pp. 1-68.*
Hierold, "Intelligent CMOS Sensors," 2000, IEEE, pp. 1-6.*
Brosnjhan et al., "Optical iMEMS—A Fabrication Process for MEMS Optical Switches with Integrated on-chip Electronics", 2003, IEEE, 12th International Conference on Solid State Sensors, Actuators and Microsystems, pp. 1638-1642.*
Candler et al., Single wafer encapsulation of MEMS devices, IEEE Transactions on Advanced Packaging, vol. 26, No. 3, Aug. 2003, pp. 227-232.
Jourdain, K., et al., From Zero-to-Second-Level Packaging of RF-MEMS Devices, IEEE May 2005.
Lund, J., et al., A Low Temperature Bi-CMOS Compatible Process for MEMS RF Resonators and Filters, Solid-State Sensor, Actuator and Microsystem Workshop, Jun. 2-6, 2002.

(Continued)

Primary Examiner—Alexander G Ghyka
Assistant Examiner—Leonard Chang
(74) Attorney, Agent, or Firm—Ingrassia, Fisher & Lorenz, P.C.

(57) ABSTRACT

A method is provided for constructing a microelectronic assembly. A semiconductor substrate having a MEMS device formed on a first portion thereof, a semiconductor device formed on a second portion thereof, and a build up layer having a first portion formed over the MEMS device and a second portion formed over the semiconductor device is provided. The first portion of the build up layer over the MEMS device is removed. A release body is formed adjacent to the MEMS device. A structural material is formed over the release body. An opening is formed in the structural material to expose the release body. The release body is removed through the opening to form a cavity between the MEMS device and the structural material. The opening in the structural material is sealed with a sealing material.

19 Claims, 6 Drawing Sheets

OTHER PUBLICATIONS

Jahnes, C.V., et al., Simultaneous Fabrication of RF MEMS Switches and Resonators Using Copper-Based CMOS Interconnect Manufacturing Methods, IEEE, 2004.

Topol, A.W., et al., Enabling Technologies for Wafer-Level Bonding of 3D MEMS and Integrated Circuit Structures, 2004 Electronic Components and Technology Conference, IEEE Jun. 2004.

* cited by examiner

METHOD FOR FORMING AND SEALING A CAVITY FOR AN INTEGRATED MEMS DEVICE

FIELD OF THE INVENTION

The present invention generally relates to micro-electromechanical system (MEMS) devices, and more particularly relates to a method for forming and sealing a cavity for a MEMS device.

BACKGROUND OF THE INVENTION

Integrated circuit devices (i.e., integrated circuits) are formed on semiconductor substrates, or wafers. The wafers are then sawed into microelectronic dies (or "dice"), or semiconductor chips, with each die carrying a respective integrated circuit. Each semiconductor chip is mounted to a package, or carrier, substrate using either wirebonding or "flip-chip" connections. The packaged chip is then typically mounted to a circuit board, or motherboard, before being installed in an electronic or computing system.

Depending on the intended use of the semiconductor chip, one of the types of individual devices formed on the semiconductor substrate may be a micro-electromechanical system (MEMS) device. MEMS devices are often used in such devices as gyroscopes, accelerometers, resonators, filters, oscillators, switches, and variable capacitors. One particular type of MEMS device is known as an "interleaved" MEMS device. Interleaved MEMS devices are formed using many of the same processing steps, such as complimentary metal oxide semiconductor (CMOS) processing, that are used to form other devices (e.g., transistors) on the substrate and often incorporate a processing layer (e.g., polycrystalline silicon) that is also used to form a portion (e.g., a gate electrode) of one of the other types of devices.

After the various devices have been formed on the substrate, multiple insulating layers and conductors are formed on the substrate and over the devices to protect the devices, as well as provide contact pads so that electrical connections can be made to the devices, during what is referred to as "back-end" processing. Additionally, particular types of MEMS devices, such as resonators, switches, and variable capacitors often require a cavity, often formed during backend processing, in which to move in order to work properly. The cavities formed around such MEMS devices are typically sealed to protect the MEMS device from contaminates and moisture, as well as provide a controlled-pressure atmosphere for specific types of MEMS devices. In order to form such a cavity, additional processing steps are typically required. These additional processing steps have been unsuccessful when using completely unmodified backend process integration. On the other hand such MEMS devices can be added to CMOS devices and sealed using processes and machines other than those used to form CMOS devices. As a result, the cost of manufacturing such devices is drastically increased.

Accordingly, it is desirable to provide a method for forming the cavities around the MEMS devices using the same processing steps used to form the devices and the backend layers on the substrate. Furthermore, other desirable features and characteristics of the present invention will become apparent from the subsequent detailed description of the invention and the appended claims, taken in conjunction with the accompanying drawings and this background of the invention.

BRIEF DESCRIPTION OF THE DRAWINGS

The present invention will hereinafter be described in conjunction with the following drawing FIGs., wherein like numerals denote like elements.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention. It should also be noted that FIGS. 1-15 are merely illustrative and may not be drawn to scale.

Figure 1:
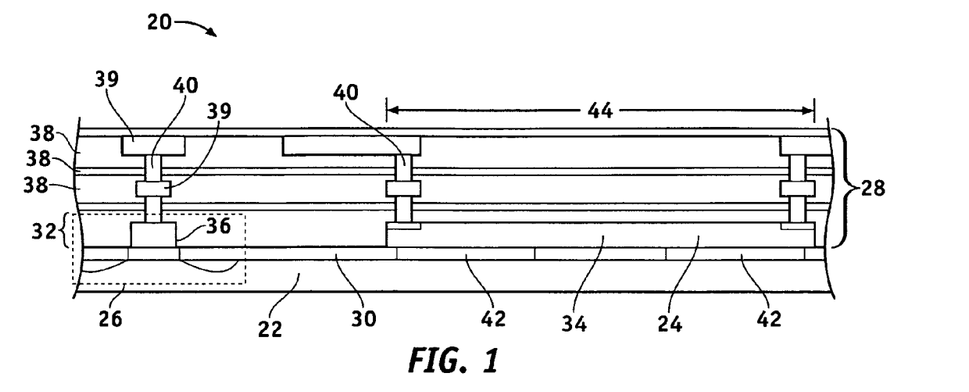
FIG. 1 is a cross-sectional side view of a semiconductor assembly including a semiconductor substrate with a micro-electromechanical system (MEMS) device, a semiconductor device, and a build up layer formed thereon.

FIGS. 1-8 illustrate a method for forming a microelectronic assembly according to one embodiment of the present invention. Referring to FIG. 1, there is illustrated a semiconductor assembly 20. The semiconductor assembly 20 includes a semiconductor substrate 22, a micro-electromechanical system (MEMS) device 24, a semiconductor device 26, and a build up layer 28. The semiconductor substrate 22 is made of a semiconductor material, such as gallium arsenide (GaAs), gallium nitride (GaN), or silicon (Si). Although not specifically illustrated, the semiconductor substrate 22 has a thickness of, for example, between approximately 300 and 1000 microns, and the semiconductor material of the substrate 22 may be of a first conductivity type, or doped with a first dopant type, as is commonly understood in the art. In one embodiment, the substrate 22 is a "P-Type" semiconductor substrate and is doped with boron (B). The substrate 22 is shown having a bulk semiconductor configuration. However, in other embodiments, the substrate 22 may have a semiconductor-on-insulator (SOI) configuration.

Although only a portion of the semiconductor substrate 22, and the semiconductor assembly 20 as a whole is illustrated in FIG. 1, it should be understood that the substrate 22 may be a semiconductor wafer with a diameter of, for example, approximately 150, 200, or 300 mm. Additionally, although not specifically illustrated, the substrate 22, as well as the entire semiconductor assembly 20, may be divided into multiple dies, or "dice," as is commonly understood in the art. Furthermore, although the following process steps may be shown as being performed on only a small portion of the substrate 22, it should be understood that each of the steps may be performed on substantially the entire substrate 22, or multiple dice, simultaneously. Furthermore, although not shown, it should be understood that the processing steps described below may be facilitated by the deposition and exposure of multiple photoresist layers, as is commonly understood.

Still referring to FIG. 1, the MEMS device 24 and the semiconductor device 26, for example, a complimentary metal oxide semiconductor (CMOS), are formed over respective first and second portions of the semiconductor substrate 22. The MEMS device 24 may be, for example, a gyroscope, an accelerometer, a resonator, a filter, an oscillator, a switch, and/or a variable capacitor. The semiconductor device 26 may be a transistor, as is commonly understood in the art. In the example illustrated in FIG. 1, both the MEMS device 24 and the semiconductor device 26 incorporate a gate dielectric layer 30 and a polycrystalline silicon layer 32 that have been formed over the upper surface of the substrate 22. The MEMS device 24 may incorporate a portion of the polycrystalline silicon layer 32 to form a body or an active region 34 of the MEMS device 24. The active region 34 may be a portion of the MEMS device 24 which actuates, or moves, during use, depending on the type of MEMS device. The semiconductor device 32 may incorporate another portion of the polycrystalline silicon layer 32 to form a gate electrode 36, as is commonly understood in the art. The portion of the polycrystalline silicon layer 32 forming the active region 34 of the MEMS device may be made thicker than the portion that forms the gate electrode 36 thru multiple polycrystalline silicon depositions. The MEMS device 24 may incorporate a portion of the gate dielectric layer 30 as a spacer between the active region 34 and the upper surface of the semiconductor substrate 22. The semiconductor device 26 may incorporate another portion of the gate dielectric layer 30 to form a gate dielectric beneath the gate electrode 36, as is commonly understood. The spacer portion of the gate dielectric 30 below the MEMS active region 34 may be made thicker than the portion that forms the gate dielectric layer 30 thru additional dielectric depositions.

The build up layer 28 includes various insulating layers 38 and conductive traces 39, as well as conductive vias 40, and may have a thickness of, for example, between 2 and 10 microns as measured from the upper surface of the semiconductor substrate 22. As illustrated, the conductive vias 40, together with portions of conductive traces 39, interconnect the MEMS device 24 and the semiconductor device 26 to an upper portion or region of the build up layer 28. As will be appreciated by one skilled in the art, the completion of the formation of the build up layer 28 over the MEMS device 24 and the semiconductor device 26 may be performed using, for example, dual-inlaid processing steps and may nearly complete the "backend" manufacturing steps that are typically required on such devices. Furthermore, the formation of the MEMS device 24, as well as the semiconductor device 26, may also be included in the CMOS processing steps such that the MEMS device 24 is what is known as an integrated or "interleaved" MEMS device, as is commonly understood. The MEMS device 24 may also include anchor formations 42 that interconnect the active region 34 and the upper surface of the substrate 22 and may be substantially square with a side length 44 of, for example, between 10 and 1000 microns.

Figure 2:
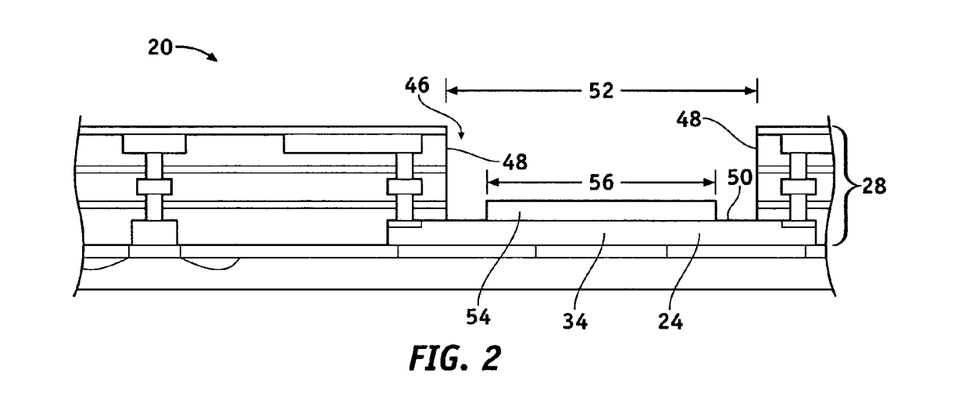
FIG. 2 is a cross-sectional side view of the semiconductor assembly FIG. 1 with a depression formed in the build up layer and a release body formed on a floor of the depression.

As illustrated in FIG. 2, a depression 46, or a trench, is then formed in the portion of the build up layer 28 over the MEMS device 24. The depression 46 includes opposing inner walls 48 and a floor 50, which may be partially formed by an upper surface of the MEMS device 24, as the depression 46 may extend entirely through the build up layer to expose the MEMS device 24. The depression 46 may be substantially square with a side length 52 of, for example, between 6 and 900 microns. The depression 46 may be formed using a dry etching process (e.g., an alternating oxide/metal etching process or other process), as is commonly understood.

Still referring to FIG. 2 a release body 54, or a sacrificial material, is then formed over a central portion of the floor 50 of the depression 46 or the upper surface of the MEMS device 24. The release body 54 has, for example, a length 56 of between 5 and 850 microns and a thickness between 500 angstroms (Å) and 5 microns. The release body 54, in one embodiment, is made of the same material as at least one of the interlayer dielectric layers within the build up layer 28, such as silicon oxide ($SiO_2$). The release body 54 may also be made of other oxide materials, photoresist layers, and/or organic materials.

Figure 3:
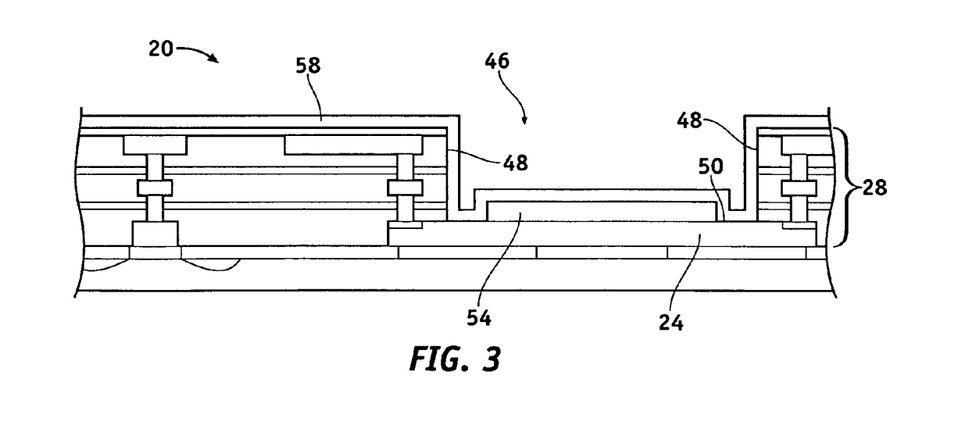
FIG. 3 is a cross-sectional side view of the semiconductor assembly of FIG. 2 with an etch stop layer formed over the build up layer and within the depression.

Referring to FIG. 3, an etch stop layer 58 is then formed over the build up layer 28 and within the depression 46. As shown the etch stop layer 58 completely covers both the inner walls 48 and the floor 50 of the depression 46, as well as the release body 54. The etch stop layer 58 may be made of a nitride, such as silicon nitride (SiN) and may have a thickness of, for example, between 200 Å and 3 microns.

Figure 4:
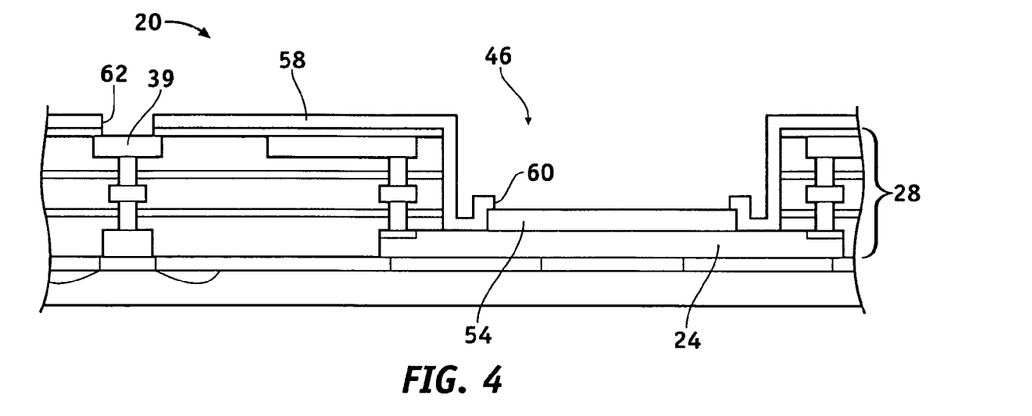
FIG. 4 is a cross-sectional side view of the semiconductor assembly of FIG. 3 after the etch stop layer has been selectively etched.

As shown in FIG. 4, a release body opening 60 and a contact pad opening 62 are then selectively etched through the etch stop layer 58. The release body opening 60 is located immediately above the release body 54 and is sized and positioned such that an upper surface of the release body is substantially completely exposed. The contact pad opening 62 may be positioned immediately above one or several of the conductive traces 39 within the build up layer 28 and extend through the upper most portion of the build up layer 28, as well as the etch stop layer 58, to expose the adjacent conductive trace 39.

Figure 5:
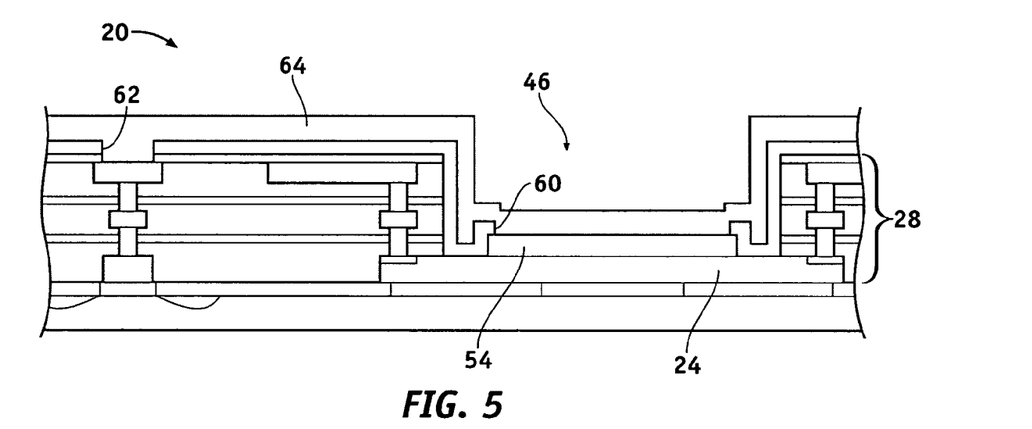
FIG. 5 is a cross-sectional side view of the semiconductor assembly of FIG. 4 with a structural layer formed over the build up layer and within the depression.

Next, as illustrated in FIG. 5, a structural layer 64 is then formed over the build up layer 28 and within the depression 46. As shown, the structural layer 64 fills both the release body opening 60 and the contact pad opening 62. The structural layer 64 may include a conductive barrier layer and be made of a conductive material, such as a mixture of aluminum and copper, and may be deposited using sputtering, as is commonly used in the art. The structural layer 64 may have a thickness of, for example, between 1 and 10 microns. As will be described in further detail below, a portion of the structural layer 64 over the release body 54 may form a cavity structure over the MEMS device 24.

Figure 6:
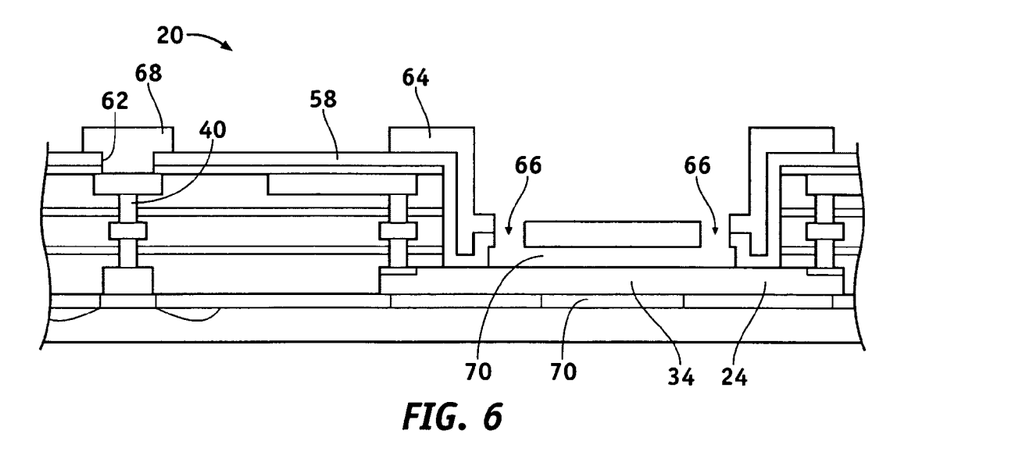
FIG. 6 is a cross-sectional side view of the semiconductor assembly of FIG. 5 after the structural layer has been selectively etched.
Figure 8:
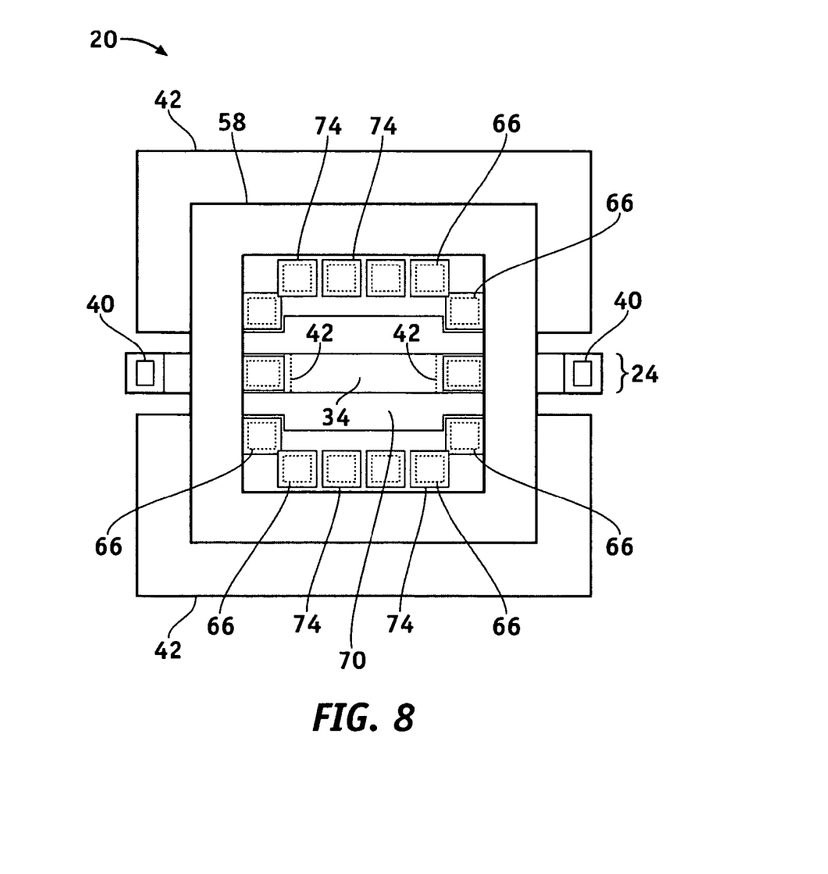
FIG. 8 is a cross-sectional top plan view of the semiconductor assembly of FIG. 7 taken along line 8-8.

Referring ahead to FIG. 8 in combination with FIG. 6, the structural layer 64 is then selectively etched to form a plurality of etch openings 66 over the release body 54. As shown specifically in FIG. 8, the etch openings 66 may be formed around a periphery of the active region 34 of the MEMS device 24. Referring again to FIG. 6, at the same time the etch openings 66 are formed, the selective etching of the structural layer 64 also forms a contact pad 68 (or upper conductive structure) from the structural layer 64 over the contact pad opening 62.

Still referring to FIGS. 6 and 8, the release body 54 is then isotropically etched through the etch openings 66. As will be appreciated by one skilled in the art, such an isotropic etch removes the material of the release body 54 at a relatively high rate, while etching the materials of the etch stop layer 58 and the structural layer 64 at relatively slow rates, and the materials of the MEMS device 24 at a negligible rate. Thus, the release body 54 is removed from the semiconductor assembly 20 and a cavity 70 is formed between the structural layer 64 and the MEMS device 24, in particular the active region 34 of the MEMS device 24. The isotropic etch may be performed using a processing gas, such as xenon difluoride ($XeF_2$), a vapor or liquid containing HF, or a plasma containing oxygen, depending on the materials of the release body to be removed. In one embodiment of the present invention, the isotropic etching process continues around the outer edges of the MEMS device 24 to etch the portion of the gate dielectric layer 30 that is located below the active region 34 of the MEMS device 24. In such an embodiment, the cavity 70 is located above, below, and to the sides of the active region 34 of the MEMS device 24.

Figure 7:
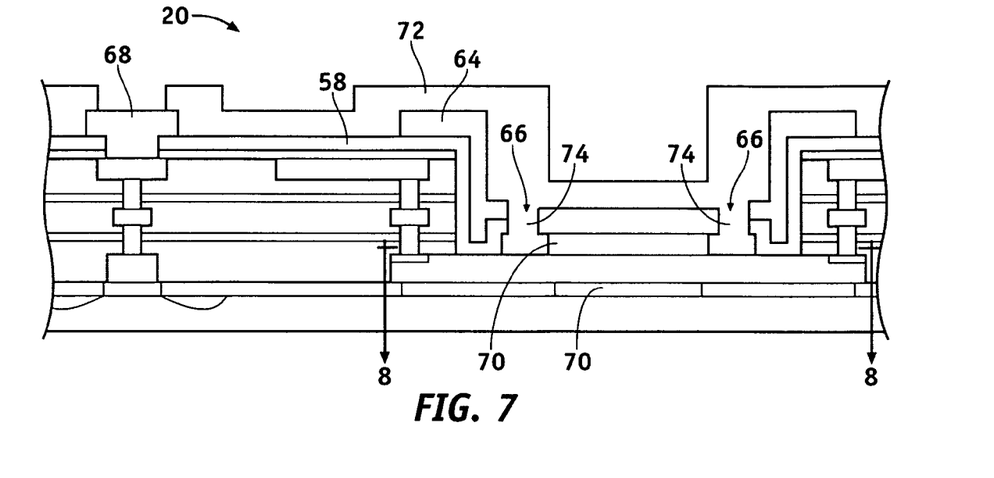
FIG. 7 is a cross-sectional side view of the semiconductor assembly of FIG. 6 with a sealing layer formed over the structural layer in with the depression thus forming a microelectronic assembly according to one embodiment of the present invention.

Referring to FIG. 7 in combination with FIG. 8, a sealing layer 72 is then formed over the remaining portions 64 and the exposed portions of the etch stop layer 58. As shown, the sealing layer 72 also fills the etch openings 66 to form a plurality of sealing pillars 74 within the etch openings 66. The formation of the sealing layer 72, and in particular the sealing pillars 74, substantially seals the cavity 70 from the outside atmosphere. As will be appreciated by one skilled in the art, the formation of the sealing layer 72 may be performed under specific atmospheric conditions such that the atmospheric pressure within the cavity 70 may be controlled. In one embodiment, the sealing layer 72 is formed in a vacuum chamber such that a vacuum exists in the cavity 70 after the formation of the sealing layer 72. The sealing layer 72 may consist of multiple depositions of different materials.

As shown in FIG. 7, a portion of the sealing layer 72 above the contact pad 68 may be removed so that an electrical connection may be made to the contact pad 68. The sealing layer 72 may be made of a dielectric or insulating material, such as silicon dioxide ($SiO_2$) or silicon nitride (SiN) and may be formed using chemical vapor deposition (CVD). The formation of the sealing layer 72 may complete the formation of a microelectronic assembly utilizing entirely CMOS processing steps, as is commonly understood, according to one embodiment of the present invention.

After final processing steps, the semiconductor device assembly 20, or the semiconductor substrate 22, may be separated into individual microelectronic die, or semiconductor chips, packaged and installed in a various electronic or computing systems. During operation, because of the cavity 70 that is formed around the active region 34 of the MEMS device 24, the active region 34 has the space it needs to move, as is the case with a resonator, without contacting the other portions of the device, thus allowing the MEMS device 24 to operate properly and prevent the active region 34 from becoming damaged.

One advantage of the method described above is that a cavity may be formed around the MEMS device, and subsequently be sealed, using standard CMOS processing steps. Therefore, the microelectronic assembly described above may be manufactured with minimal modifications to the processing apparatuses and tools that are used to construct such devices. As a result, the costs of manufacturing the assembly are minimized.

Figure 9:
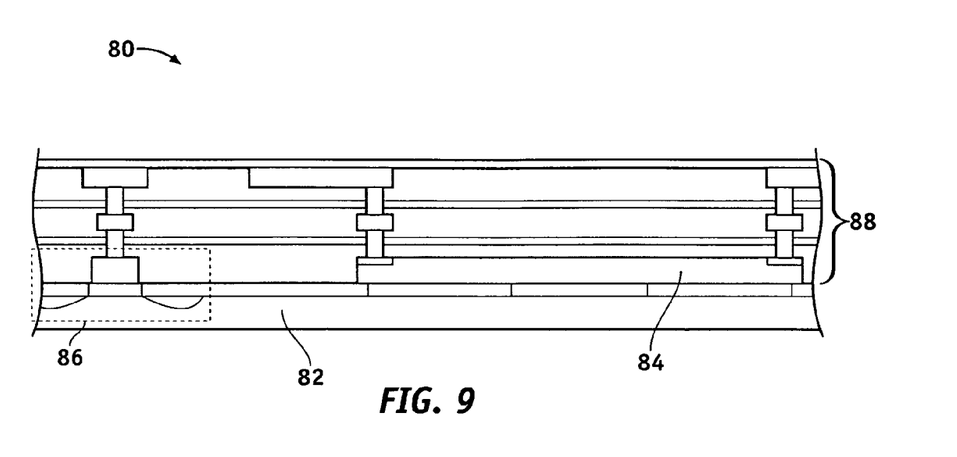
FIGS. 9-15 are cross-sectional side views of a semiconductor assembly illustrating a method for forming a microelectronic assembly according another embodiment of the present invention.
Figure 10:
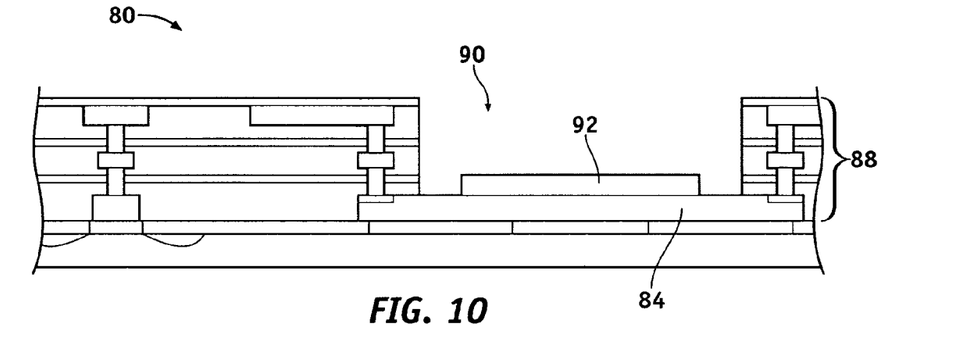
Figure 11:
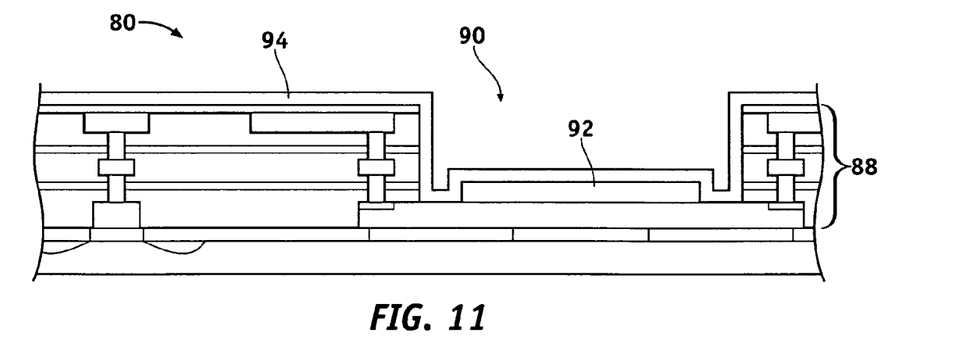

FIGS. 9-15 illustrate a method for forming a microelectronic assembly according to another embodiment of the present invention. Referring to FIG. 9, there is illustrated a semiconductor assembly 80, which may be similar to the semiconductor assembly 20 illustrated in FIG. 1 and likewise includes a semiconductor substrate 82, a MEMS device 84, a semiconductor device 86, and a build up layer 88 formed over the MEMS device 84 and the semiconductor device 86. As illustrated in FIGS. 10 and 11, a depression 90 is formed in the portion of the build up layer 88 over the MEMS device 84, a release body 92 is formed on a central portion of the MEMS device 84, and an etch stop layer 94 is formed over the build up layer 88 and the release body 92 and within the depression 90, in a manner similar to that illustrated in FIGS. 2 and 3. However, the etch stop layer 94 illustrated in FIG. 11 may be formed to a greater thickness than the etch stop layer 58 illustrated in FIG. 3. The etch stop layer 94 may have a thickness of, for example, between 0.5 and 10 microns. As will be apparent from the description below, in the embodiment illustrated in FIGS. 9-15, the etch stop layer 94 serves as both an etch stop layer and a structural layer, which defines a cavity for the MEMS device 84 in a similar fashion to the structural layer 64 shown in FIG. 6.

Figure 12:
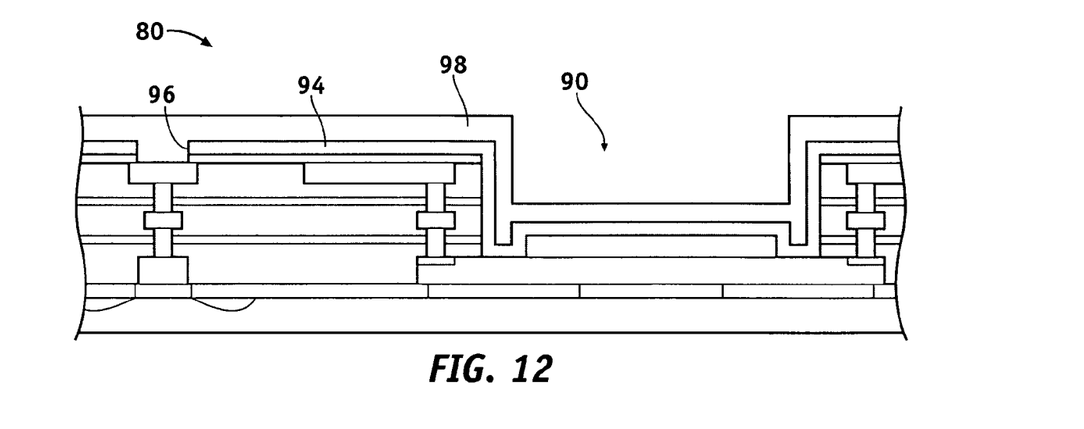
Figure 13:
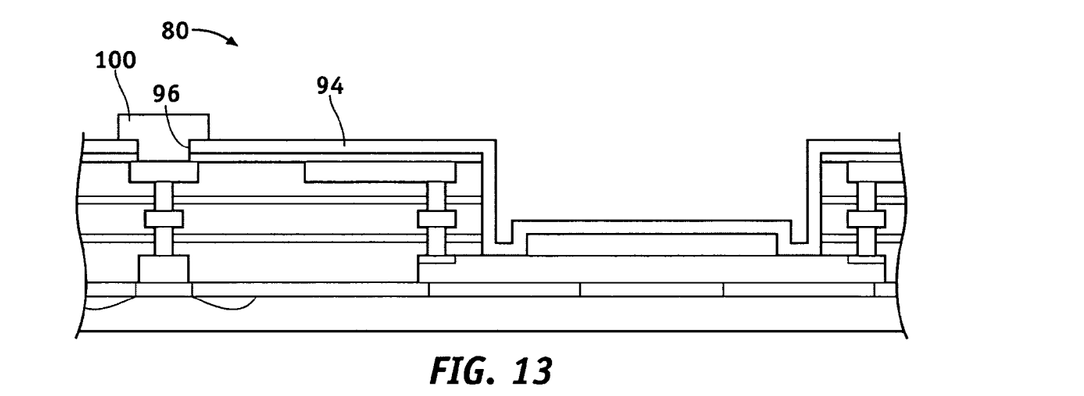

As illustrated in FIG. 12, a contact pad opening 96, similar to the contact pad opening 62 illustrated in FIG. 4, is formed in the etch stop layer 94, and a conductive layer 98, similar to the structural layer 64 illustrated in FIG. 5, is then formed over the etch stop layer 94. As shown in FIG. 13, the conductive layer 98 is then selectively etched to leave only a contact pad 100, similar to the contact pad 68 illustrated in FIG. 6, within the contact pad opening 96.

Figure 14:
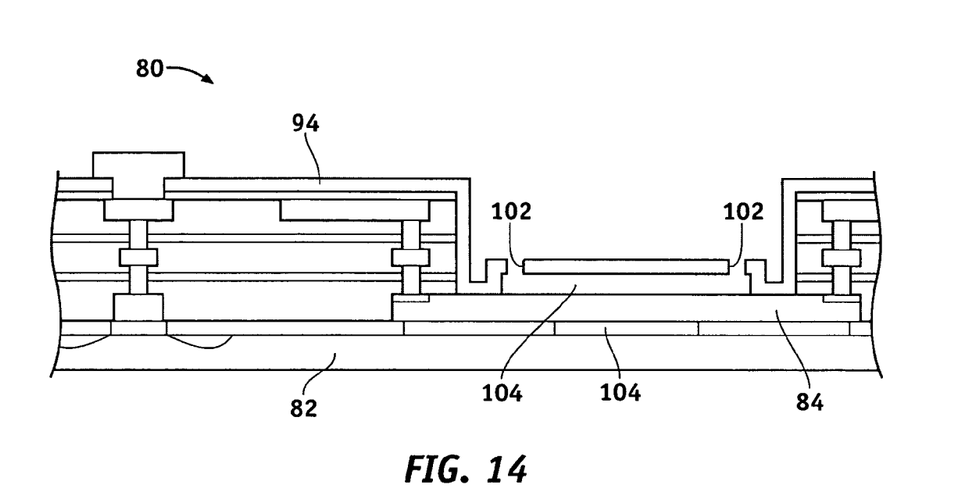
Figure 15:
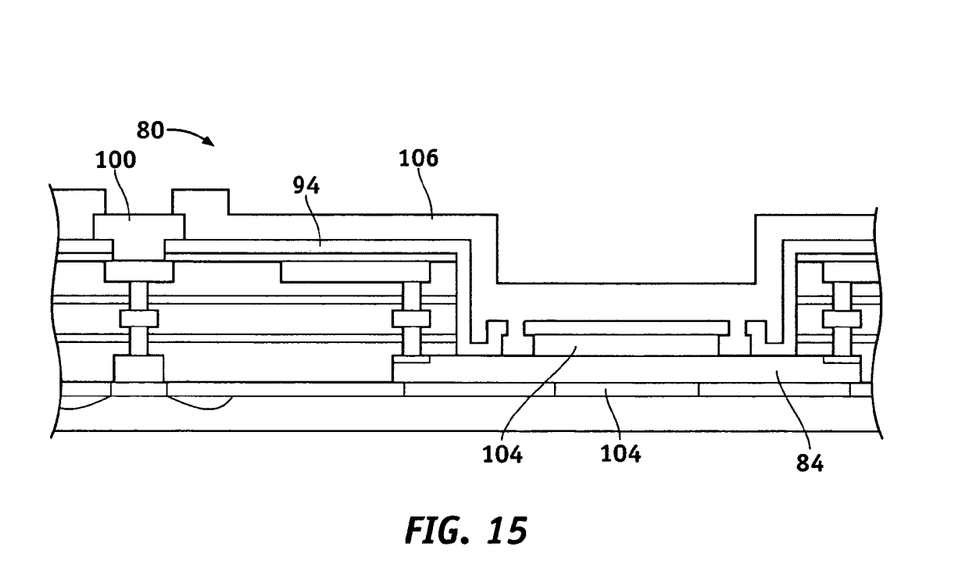

A plurality etch openings 102, similar to the etch openings 66 illustrated in FIG. 6, are then formed in the etch stop layer 94 above the release body 92, as shown in FIG. 14. The release body 92 is then isotropically etched through the etch openings 102 in a manner similarly illustrated in FIG. 6. As a result, still referring to FIG. 14, a cavity 104 is formed between the etch stop layer 94 and the MEMS device 84. As described before, the cavity 104 may also be formed between the substrate 82 and the MEMS device 84. As illustrated in FIG. 15, a sealing layer 106 is formed over the etch stop layer 94 to seal the cavity 104 from the outside atmosphere. As shown, a portion of the sealing layer 106 above the contact pad 100 may be removed so that an electrical connection may be made to the contact pad and thus the assembly 80.

A further advantage of the embodiment illustrated in FIGS. 9-15 is that the cavity 104 may be formed and sealed after the conductive layer has been removed. As a result, any MEMS devices which may experience electrical coupling with any metal objects may be used in the device 80.

The invention provides a method for constructing a microelectronic assembly. A substrate having a MEMS device formed on a first portion thereof, a semiconductor device formed on a second portion thereof, and a build up layer formed over the MEMS device and the semiconductor device is provided. A first portion of the build up layer over the MEMS device is removed. A release body is formed over to the MEMS device. A structural material is formed over the release body. An opening is formed in the structural material to expose the release body. The release body is removed through the opening to form a cavity between the MEMS device and the structural material. The opening in the structural material is sealed with a sealing material.

The build up layer may include a plurality of insulating layers and conductors. The conductors may electrically connect at least one of the MEMS device and the semiconductor device to an upper conductive structure within the build up layer. The release body may be formed at least one of above and below the MEMS device. The release body may have a first width and the opening in the structural material may have a second width. The second width may be less than the first width.

The removal of the release body through the opening may include isotropically etching the release body through the opening. The removal of the first portion of the build up layer may include forming a depression in the upper portion of the build up layer. The depression may have opposing inner walls and a floor. An upper surface of the MEMS device may at least partially define the floor of the depression.

The method may also include forming an etch stop layer over the opposing inner walls of the depression. The release body may be an upper release body and formed on the upper surface of the MEMS device. The structural material may be formed over the upper release body.

The semiconductor substrate may also include a lower release body formed below the MEMS device. The isotropic etching may remove the upper release body and the lower release body such that the cavity lies above and below the MEMS device. The MEMS device may include at least one of a gyroscope, an accelerometer, a resonator, a filter, an oscillator, a switch, and a variable capacitor.

The invention also provides a method for constructing a microelectronic assembly comprising a semiconductor substrate having a MEMS device formed on a first portion thereof, a semiconductor device formed on a second portion thereof, and a build up layer formed over the MEMS device and the semiconductor device is provided. The build up layer includes a plurality of insulating layers and conductors. The conductors electrically connect the MEMS device and the semiconductor device to an upper conductive structure within the build up layer. A portion of the build up layer over the MEMS device is removed. A release body is formed adjacent to and above the MEMS device. The release body has a first width. A structural material is formed over the release body. An opening is formed in the structural material to expose the release body. The opening may have a second width that is less than the first width. The release body is isotropically etched through the opening to form a cavity between the MEMS device and the structural material. A sealing material is formed over the opening to seal the cavity.

The removal of the first portion of the build up layer may include forming a depression in the upper portion of the build up layer. The depression may have opposing inner walls and a floor. An upper surface of the MEMS device may at least partially define the floor of the depression.

The release body may be an upper release body and be formed on the upper surface of the MEMS device. The structural material may be formed over the upper release body. The semiconductor substrate may also include a lower release body formed below the MEMS device. The isotropic etching may remove the upper release body and the lower release body such that the cavity lies above and below the MEMS device.

The method may also include forming an etch stop layer over the opposing inner walls of the depression. The semiconductor substrate may also include a processing layer formed thereon. The MEMS device and the semiconductor device may include respective first and second portions of the processing layer.

The invention further provides a microelectronic assembly including a semiconductor substrate having first and second portions, micro-electromechanical system (MEMS) device formed on the first portion of the semiconductor substrate, semiconductor device formed on the second portion of the semiconductor substrate, a build up layer having a first portion formed over the MEMS device and a second portion formed over the semiconductor device, the first portion of the build up layer having an opening therein to expose at least a portion of the MEMS device; and a structural material formed over the MEMS device such that cavity lies between the MEMS device and the structural material.

The structural material may have an opening therethrough to expose the cavity. The microelectronic assembly may also include a sealing material formed over the opening in the structural material to seal the cavity.

The build up layer may include a plurality of insulating layers and conductors, the conductors electrically connecting at least one of the MEMS device and the semiconductor device to an upper conductive structure within the build up layer. The cavity may be located above and below the MEMS device.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for constructing a microelectronic assembly comprising:
   providing a substrate having a micro-electromechanical system (MEMS) device formed on a first portion thereof, a semiconductor device formed on a second portion thereof, and a build up layer formed over the MEMS device and the semiconductor device and comprising a plurality of insulating layers and conductors, the conductors electrically connecting at least one of the MEMS device and the semiconductor device to an upper portion of the build up layer;
   removing a first portion of the build up layer over the MEMS device;
   forming a release body over the MEMS device after the removing of the first portion of the build up layer;
   forming an etch stop layer at least partially over the MEMS device and the build up layer after the forming of the release body;
   forming a structural material over the release body after the forming of the etch stop layer;
   forming an opening in the structural material to expose the release body;
   removing the release body through the opening to form a cavity between the MEMS device and the structural material; and
   sealing the opening in the structural material with a sealing material.

2. The method of claim 1, wherein the removing of the release body occurs after the first portion of the build up layer is removed.

3. The method of claim 1, wherein the release body is formed at least one of above and below the MEMS device.

4. The method of claim 1, wherein the release body has a first width and the opening in the structural material has a second width, the second width being less than the first width.

5. The method of claim 1, wherein the removal of the release body through the opening comprises isotropically etching the release body through the opening.

6. The method of claim 1, wherein the removal of the first portion of the build up layer comprises forming a depression in the upper portion of the build up layer, the depression having opposing inner walls and a floor, an upper surface of the MEMS device at least partially defining the floor of the depression.

7. The method of claim 6, further comprising forming an etch stop layer over the opposing inner walls of the depression.

8. The method of claim 1, wherein the release body is an upper release body and is formed on the upper surface of the MEMS device and the structural material is formed over the upper release body.

9. The method of claim 8, wherein the semiconductor substrate further comprises a lower release body formed below the MEMS device and the isotropic etching removes the upper release body and the lower release body such that the cavity lies above and below the MEMS device.

10. The method of claim 9, wherein the MEMS device comprises at least one of a gyroscope, an accelerometer, a resonator, a filter, an oscillator, a switch, and a variable capacitor.

11. A method for constructing a microelectronic assembly comprising:
providing a substrate having a micro-electromechanical system (MEMS) device formed on a first portion thereof, a semiconductor device formed on a second portion thereof, and a build up layer formed over the MEMS device and the semiconductor device, the build up layer comprising a plurality of insulating layers and conductors, the conductors electrically connecting at least one of the MEMS device and the semiconductor device to an upper conductive structure within the build up layer;
removing a portion of the build up layer over the MEMS device such that a depression is formed in the build up layer, the depression having opposing inner walls and a floor and an upper surface of the MEMS device at least partially defining the floor of the depression;
forming a release body adjacent to and above the MEMS device after the removing of the portion of the build up layer, the release body having a first width;
forming a structural material over the release body;
forming an opening in the structural material to expose the release body, the opening having a second width that is less than the first width;
isotropically etching the release body through the opening to form a cavity between the MEMS device and the structural material;
forming a sealing material over the opening to seal the cavity; and
forming an etch stop layer over the opposing inner walls of the depression after the forming of the release body and before the forming of the structural material.

12. The method of claim 11, wherein the removal of the portion of the build up layer comprises exposing at least a portion of the MEMS device.

13. The method of claim 11, wherein the release body is an upper release body and is formed on the upper surface of the MEMS device and the structural material is formed over the upper release body and the semiconductor substrate further comprises a lower release body formed below the MEMS device and the isotropic etching removes the upper release body and the lower release body such that the cavity lies above and below the MEMS device.

14. The method of claim 11, wherein the semiconductor substrate further comprises a selected layer formed thereon and the MEMS device and the semiconductor device comprise respective first and second portions of the selected layer.

15. A method for forming a microelectronic assembly comprising:
providing a substrate having a micro-electromechanical system (MEMS) device formed on a first portion thereof, a semiconductor device formed on a second portion thereof, and a build up layer formed over the MEMS device and the semiconductor device and including a plurality of insulating layers and conductors, the conductors electrically connecting at least one of the MEMS device and the semiconductor device to an upper portion of the build up layer;
removing a first portion of the build up layer over the MEMS device to at least partially expose the MEMS device, the removing of the first portion of the build up layer comprising forming a depression in the build up layer, the depression having opposing inner walls and a floor, an upper surface of the MEMS device at least partially defining the floor of the depression;
forming a release body over the MEMS device after the removing of the first portion of the build up layer;
forming an etch stop layer over the opposing inner walls of the depression and the release body after the forming of the of the release body;
forming a release opening in the etch stop layer to at least partially expose a selected portion of the release body;
forming a structural material over the selected portion of the release body and the etch stop layer after the forming of the eth stop layer;
forming an etch opening in the structural material to expose the selected portion of the release body;
removing the release body through the etch opening to form a cavity between the MEMS device and the structural material; and
sealing the opening in the structural material with a sealing material.

16. The method of claim 15, wherein the release body has a first width and the opening in the structural material has a second width, the second width being less than the first width.

17. The method of claim 16, wherein the removal of the release body through the opening comprises isotropically etching the release body through the opening.

18. The method of claim 15, wherein the release body is an upper release body and is formed on the upper surface of the MEMS device and the structural material is formed over the upper release body, and wherein the semiconductor substrate further comprises a lower release body formed below the MEMS device and the isotropic etching removes the upper release body and the lower release body such that the cavity lies above and below the MEMS device.

19. The method of claim 18, wherein the semiconductor substrate further comprises a selected layer formed thereon and the MEMS device and the semiconductor device comprise respective first and second portions of the selected layer, and wherein the MEMS device comprises at least one of a gyroscope, an accelerometer, a resonator, a filter, an oscillator, a switch, and a variable capacitor.

* * * * *